(12) United States Patent
Akaho

(10) Patent No.: US 11,569,742 B2
(45) Date of Patent: Jan. 31, 2023

(54) POWER SUPPLY CONTROL DEVICE

(71) Applicant: ROHM Co., LTD., Kyoto (JP)

(72) Inventor: Tadashi Akaho, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 243 days.

(21) Appl. No.: 17/109,270

(22) Filed: Dec. 2, 2020

(65) Prior Publication Data

US 2021/0167686 A1 Jun. 3, 2021

(30) Foreign Application Priority Data

Dec. 3, 2019 (JP) .............................. JP2019-219135

(51) Int. Cl.
*H02M 3/158* (2006.01)
*H03H 7/06* (2006.01)
*H03K 4/06* (2006.01)

(52) U.S. Cl.
CPC .............. *H02M 3/158* (2013.01); *H03H 7/06* (2013.01); *H03K 4/06* (2013.01)

(58) Field of Classification Search
CPC .. H02M 3/158; H02M 3/1586; H02M 3/1588; H02M 3/156

See application file for complete search history.

(56) References Cited

U.S. PATENT DOCUMENTS

| 2006/0119338 | A1* | 6/2006 | Soch | H02M 3/156 |
| | | | | 323/283 |
| 2014/0002044 | A1* | 1/2014 | Babazadeh | H02M 3/1588 |
| | | | | 323/282 |
| 2018/0226877 | A1* | 8/2018 | Fukumoto | H02M 3/1588 |

FOREIGN PATENT DOCUMENTS

JP 2017169340 9/2017

* cited by examiner

*Primary Examiner* — Nguyen Tran

(74) *Attorney, Agent, or Firm* — Chip Law Group

(57) ABSTRACT

The power supply control device includes a logic circuit for generating a pseudo switch voltage simulating a behavior of a switch voltage generated in the switch output stage, a filter unit that receives input of the pseudo switch voltage and the output voltage or a feedback voltage corresponding to the output voltage and generates a current sense signal simulating a behavior of the inductor current, and a feedback control unit that performs output feedback control of the switch output stage by using the current sense signal.

11 Claims, 10 Drawing Sheets

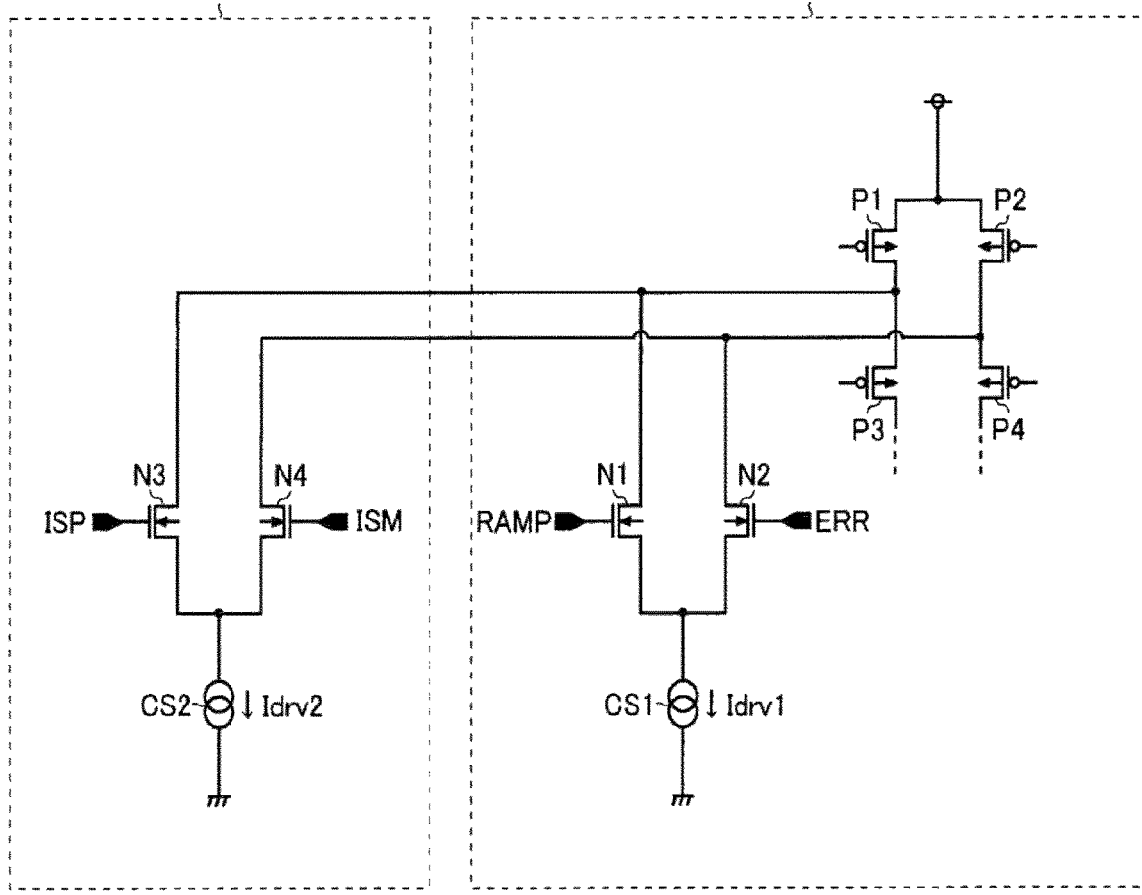

POWER SUPPLY CONTROL DEVICE

CROSS REFERENCE TO RELATED APPLICATIONS

This application claims priority benefit of Japanese Patent Application No. JP 2019-219135 filed in the Japan Patent Office on Dec. 3, 2019. Each of the above-referenced applications is hereby incorporated herein by reference in its entirety.

BACKGROUND

The technology disclosed in the present specification relates to a power supply control device.

In the past, what are generally called current mode control type switching power supplies have been installed in various applications.

As an example of the art in the past related to the above, Japanese Patent Laid-open No. 2017-169340 can be cited.

SUMMARY

However, in the switching power supply in the related art, there is room for further improvement in the method of detecting the inductor current.

In view of the above problems found by the inventor of the present application, it is desirable to provide a power supply control device capable of simulatively detecting an inductor current and performing output feedback control.

The power supply control device disclosed in the present specification is a control main body of a switching power supply that generates an output voltage from an input voltage by driving an inductor current with use of a switch output stage, and has a configuration (first configuration) including a logic circuit for generating a pseudo switch voltage simulating the behavior of a switch voltage generated in the switch output stage, a filter unit that receives input of the pseudo switch voltage and the output voltage or a feedback voltage corresponding thereto and generates a current sense signal simulating the behavior of the inductor current, and a feedback control unit that performs output feedback control of the switch output stage by using the current sense signal.

In the power supply control device having the above first configuration, a configuration (second configuration) may be adopted in which the current sense signal is a differential signal including a positive side current sense signal and a negative side current sense signal.

In the power supply control device having the above second configuration, a configuration (third configuration) may be adopted in which the filter unit includes a capacitor connecting the application terminal of the positive side current sense signal and the application terminal of the negative side current sense signal, a first resistor connecting the application terminal of the pseudo switch voltage and the application terminal of the positive side current sense signal, and a second resistor connecting the application terminal of the output voltage and the application terminal of the negative side current sense signal.

In the power supply control device having the above third configuration, a configuration (fourth configuration) may be adopted in which the filter unit further includes a third resistor connecting the application terminal of the positive side current sense signal and a reference potential terminal; and a fourth resistor connecting the application terminal of the negative side current sense signal and the reference potential terminal.

In the power supply control device having the above third or fourth configuration, a configuration (fifth configuration) may be adopted in which the filter unit further includes a fifth resistor connecting an internal power supply terminal and the application terminal of the positive side current sense signal; and a sixth resistor connecting the internal power supply terminal and the application terminal of the negative side current sense signal.

In the power supply control device having the above second configuration, a configuration (sixth configuration) may be adopted in which the filter unit includes a capacitor connecting the application terminal of the positive side current sense signal and the application terminal of the negative side current sense signal, a first resistor connecting the application terminal of the pseudo switch voltage and the application terminal of the positive side current sense signal, a second resistor connecting the application terminal of the positive side current sense signal and a reference potential terminal, and a buffer having an input terminal connected to the application terminal of the feedback voltage and an output terminal connected to the application terminal of the negative side current sense signal.

Further, in the power supply control device having any one of the second to sixth configurations, a configuration (seventh configuration) may be adopted in which the feedback control unit includes an error amplifier that generates an error signal according to a difference between the output voltage or the feedback voltage and a predetermined reference voltage, a ramp signal generation circuit that generates a ramp signal, an adding section that generates a first addition signal obtained by adding the ramp signal to the positive side current sense signal and a second addition signal obtained by adding the error signal to the negative side current sense signal, an oscillator that generates an on-signal that is pulse-driven at a predetermined frequency, and a comparator that generates an off-signal by comparing the first addition signal with the second addition signal, and the feedback control unit performs output feedback control of the switch output stage by using the on-signal and the off-signal.

Further, in the power supply control device having any one of the first to seventh configurations, a configuration (eighth configuration) may be adopted in which the switch output stage includes an output transistor and a synchronous rectification transistor, and the logic circuit turns off the synchronous rectification transistor so as to put the switch output stage into an output high impedance state when a zero cross of the inductor current is detected while the output transistor is turned off and the synchronous rectification transistor is turned on.

Further, in the power supply control device having the eighth configuration, a configuration (ninth configuration) may be adopted in which the logic circuit includes a pulse generation unit that generates a control signal for each of the output transistor and the synchronous rectification transistor according to a pulse voltage; and a multiplexer that selectively outputs one of the pulse voltage and the output voltage as the pseudo switch voltage according to the result of the zero-cross detection of the inductor current.

The power supply control device having any one of the first to ninth configurations may be integrated in a semiconductor device (tenth configuration).

Further, the switching power supply disclosed in the present specification has a power supply control device having any one of the above first to tenth configurations (eleventh configuration).

According to the technology disclosed in the present specification, it is possible to provide a power supply control device capable of pseudo-detection of an inductor current and performance of output feedback control.

BRIEF DESCRIPTION OF THE DRAWINGS

FIG. 10 is a diagram illustrating a configuration example of a comparator and an adding section;

FIG. 11 is a diagram illustrating a first configuration example of a filter unit;

DETAILED DESCRIPTION OF THE PREFERRED EMBODIMENT

<Switching Power Supply>

Figure 1:
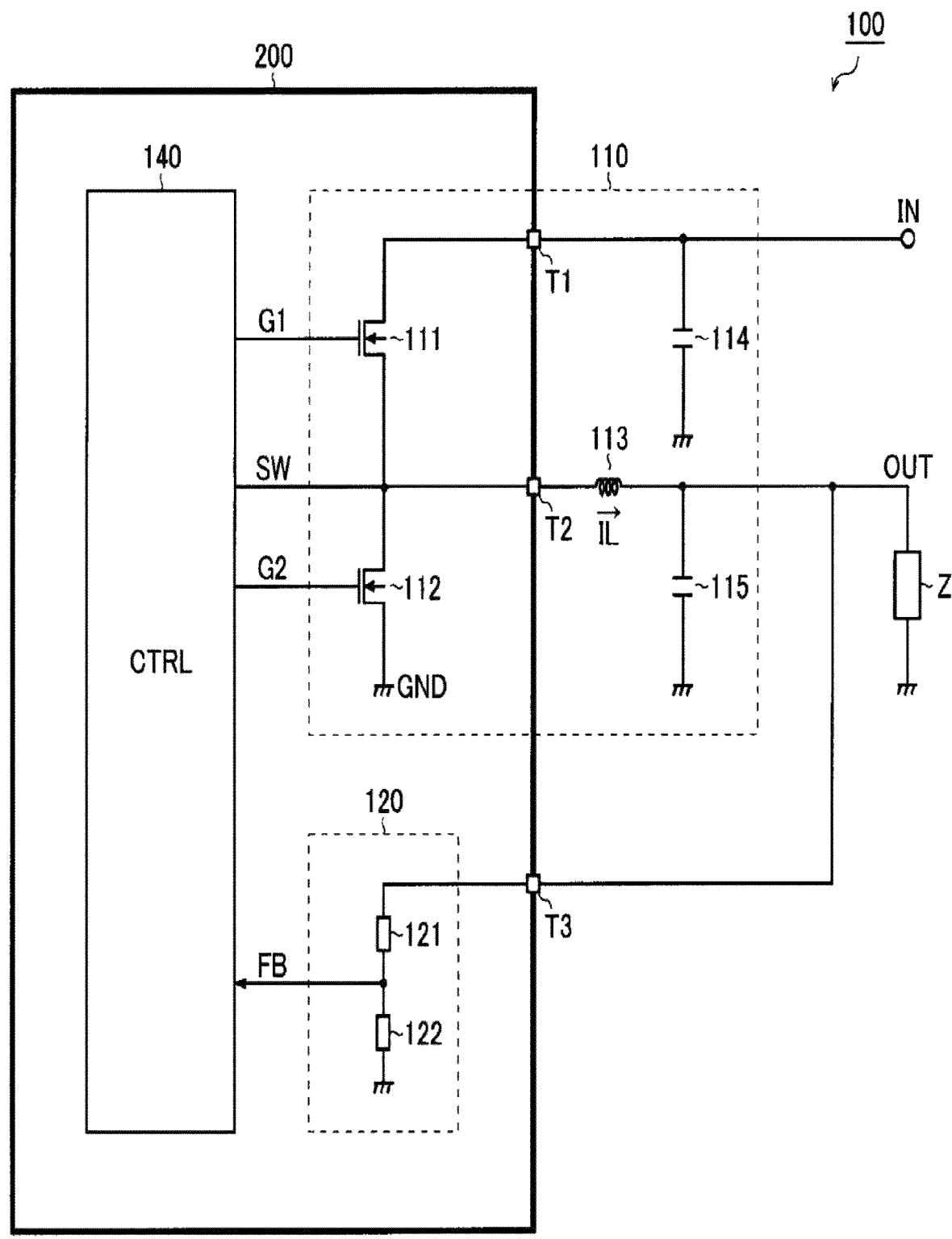
FIG. 1 is a diagram illustrating an overall configuration of a switching power supply.

FIG. 1 is a diagram illustrating the overall configuration of a switching power supply. A switching power supply 100 of the present configuration example is a direct current/direct current (DC/DC) converter that generates a desired output voltage OUT from an input voltage IN and supplies the voltage to a load Z, and includes a switch output stage 110, a feedback voltage generation circuit 120, and a control circuit 140.

The above-described components are suitable to be integrated into a semiconductor device 200 (which is what is generally called a power supply control integrated circuit (IC) and corresponds to a power supply control device) that is the control main body of the switching power supply 100, except for some components (an inductor 113 and capacitors 114 and 115 in this figure) included in the switch output stage 110. In addition to the components described above, a semiconductor device 200 may be incorporated with optional components (such as various protection circuits) as appropriate.

The semiconductor device 200 also includes a plurality of external terminals T1 to T3 as a section for establishing an electrical connection with the outside of the device.

The switch output stage 110 is a step-down type that drives an inductor current IL by turning on/off an upper switch and a lower switch that are connected so as to form a half bridge and generates a desired output voltage OUT from the input voltage IN, and includes an output transistor 111, a synchronous rectification transistor 112, an inductor 113, and capacitors 114 and 115.

The output transistor 111 is an N-channel type metal oxide semiconductor field effect transistor (NMOSFET) that functions as an upper switch of the switch output stage 110. Inside the semiconductor device 200, the drain of the output transistor 111 is connected to the external terminal T1 (=application terminal of the input voltage IN). The source of the output transistor 111 is connected to the external terminal T2 (=application terminal of a switch voltage SW). The gate of the output transistor 111 is connected to the application terminal of an upper gate signal G1. The output transistor 111 is turned on when the upper gate signal G1 is at a high level and is turned off when the upper gate signal G1 is at a low level. When an NMOSFET is used as the output transistor 111, a bootstrap circuit or a charge pump circuit (not illustrated in this figure) for raising the high level of the upper gate signal G1 to a voltage value higher than the input voltage IN may be necessary.

The synchronous rectification transistor 112 is an NMOSFET that functions as a lower switch of the switch output stage 110. Inside the semiconductor device 200, the drain of the synchronous rectification transistor 112 is connected to the external terminal T2 (=application terminal of the switch voltage SW). The source of the synchronous rectification transistor 112 is connected to the ground terminal (=application terminal of a ground voltage GND). The gate of the synchronous rectification transistor 112 is connected to the application terminal of a lower gate signal G2. The synchronous rectification transistor 112 is turned on when the lower gate signal G2 is at a high level and is turned off when the lower gate signal G2 is at a low level.

The inductor 113 and the capacitors 114 and 115 are discrete components externally attached to the semiconductor device 200. The first end of the capacitor 114 is connected to the external terminal T1 of the semiconductor device 200. The second end of the capacitor 114 is connected to the ground terminal. The first end of the inductor 113 is connected to the external terminal T2 of the semiconductor device 200. The second end of the inductor 113 and the first end of the capacitor 115 are connected to the application terminal of the output voltage OUT and the external terminal T3 of the semiconductor device 200. The second end of the capacitor 115 is connected to the ground terminal. The capacitor 114 functions as an input capacitor for smoothing the input voltage IN. Further, the inductor 113 and the capacitor 115 function as an inductance-capacitance (LC) filter that rectifies and smooths the switch voltage SW to generate the output voltage OUT.

The output transistor 111 and the synchronous rectification transistor 112 are basically turned on/off complementarily according to the upper gate signal G1 and the lower gate signal G2. By such an on/off operation, a rectangular wave-shaped switch voltage SW pulse-driven between the input voltage IN and the ground voltage GND is generated at the first end of the inductor 113. It should be understood that the meaning of the word "complementarily" described above includes not only the case where the on/off states of the output transistor 111 and the synchronous rectification transistor 112 are completely inverted, but also the case where the both transistors are simultaneously turned off (dead time). Further, when the zero cross of the inductor current IL is detected (when the reverse current is detected), both the output transistor 111 and the synchronous rectification transistor 112 are turned off, and the driving of the switch output stage 110 can temporarily be stopped (details will be described later).

The output type of the switch output stage 110 is not limited to the step-down type described above and may be a step-up type, a step-up/down type, or an inversion type.

Further, the output transistor 111 can be replaced with a P-channel type MOSFET (PMOSFET). In that case, the above-mentioned bootstrap circuit and charge pump circuit become unnecessary.

Further, the output transistor 111 and the synchronous rectification transistor 112 can be externally attached to the semiconductor device 200. In that case, instead of the external terminal T2, external terminals for outputting the upper gate signal G1 and the lower gate signal G2 to the outside of the device respectively, and an external terminal for receiving the input of the switch voltage SW may be necessary.

When a high voltage is applied to the switch output stage 110, a high withstand voltage element such as a power MOSFET, an insulated gate bipolar transistor (IGBT), or a silicon carbide (SiC) transistor is preferably used as the output transistor 111 or the synchronous rectification transistor 112.

The feedback voltage generation circuit 120 includes resistors 121 and 122 connected in series between the external terminal T3 (=application terminal of the output voltage OUT) and a ground terminal and outputs a feedback voltage FB according to the output voltage OUT (=the divided voltage of the output voltage OUT) from a connection node between the both resistors.

Further, when the output voltage OUT is within the input dynamic range of the control circuit 140, the feedback voltage generation circuit 120 may be omitted and the output voltage OUT itself may directly be input to the control circuit 140 as the feedback voltage FB. Furthermore, a speed-up capacitor may be connected in parallel to the resistor 121. Still further, the feedback voltage generation circuit 120 may be externally attached to the semiconductor device 200.

As a basic output feedback control, the control circuit 140 has a normal mode (PWM mode) for performing control of pulse width modulation on each of the upper gate signal G1 and the lower gate signal G2 so that the feedback voltage FB agrees with a predetermined target value (reference voltage REF to be described later).

Further, the control circuit 140 also has a light load mode (PFM mode) for thinning out the switching pulse to reduce the switching loss by repeating drive stops of the switch output stage 110 (=output high impedance state) and drive recoveries thereof (=restarting complementary switching operation) within a range in which the output voltage OUT does not fall below the target value, under a light load.

Further, the control circuit 140 also has a function of pseudo-detecting the inductor current IL and performing output feedback control of a current mode control method (details will be described later).

<Consideration Regarding Current Detection Method>

Figure 2:
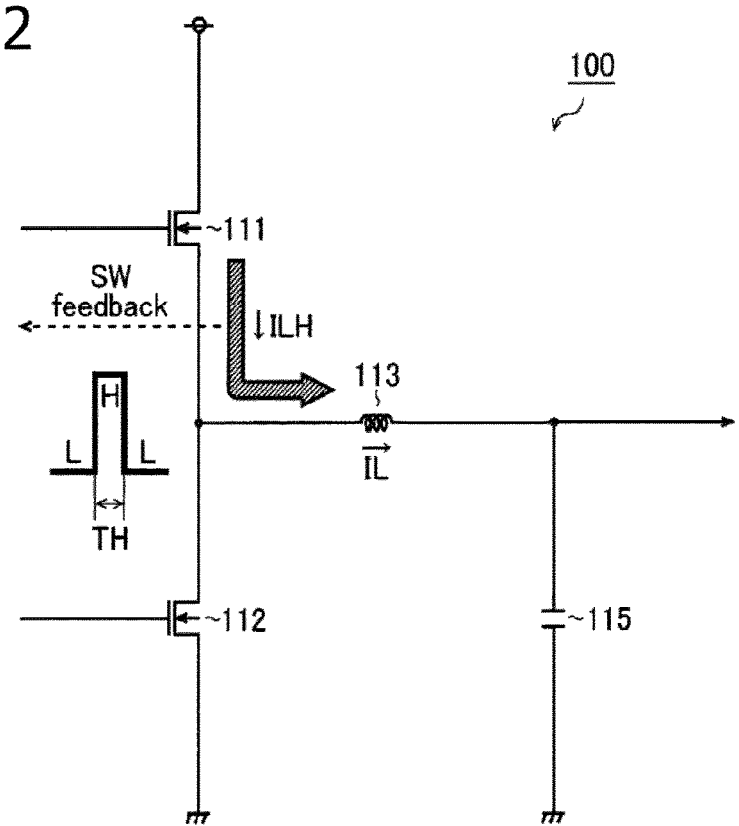
FIG. 2 is a diagram illustrating a first example of the current detection method (upper side current detection method)

FIG. 2 is a diagram illustrating a first example of the current detection method (upper side current detection method). In the current detection method of this figure, during the ON period of the output transistor 111 (=high level period TH of the switch voltage SW), the current information is fed back to the control circuit 140 by detecting the high level of the switch voltage SW (=IN−ILH× RonH, where ILH is an upper side inductor current flowing to the output transistor 111 and RonH is the ON resistance of the output transistor 111). However, in this method, when the high level period TH of the switch voltage SW becomes shorter than the lower limit value (for example, 30 ns), the current information may not be fed back correctly. Therefore, low duty operation is difficult.

Figure 3:
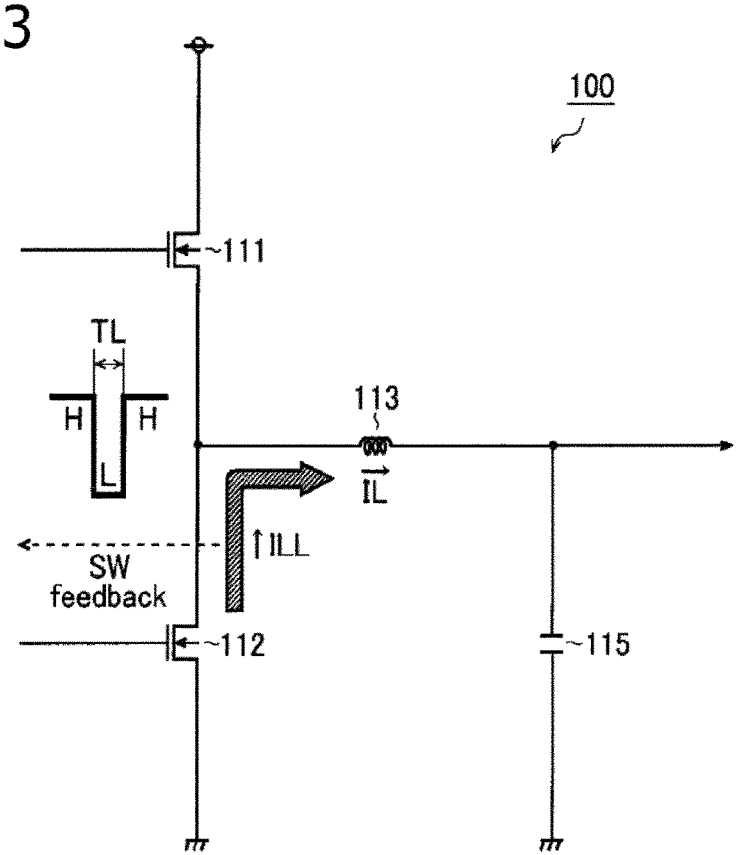
FIG. 3 is a diagram illustrating a second example of the current detection method (lower side current detection method)

FIG. 3 is a diagram illustrating a second example of the current detection method (lower side current detection method). According to the current detection method of this figure, during the ON period of the synchronous rectification transistor 112 (=low level period TL of the switch voltage SW), the current information is fed back to the control circuit 140 by detecting the low level of the switch voltage SW (=GND−ILL× RonL, where ILL is a lower side inductor current flowing in the synchronous rectification transistor 112 and RonL is the ON resistance of the synchronous rectification transistor 112). However, in this method, when the low level period TL of the switch voltage SW becomes shorter than the lower limit value (for example, 30 ns), the current information may not be fed back correctly. Therefore, high duty operation is difficult.

For example, when the switching frequency fsw is 12 MHz, since a switching cycle T is only 83 ns, both the high level period TH and the low level period TL of the switch voltage SW can fall below the above lower limit value. Therefore, whichever current detection methods described above is adopted, it becomes difficult to feed back current information correctly.

Figure 4:
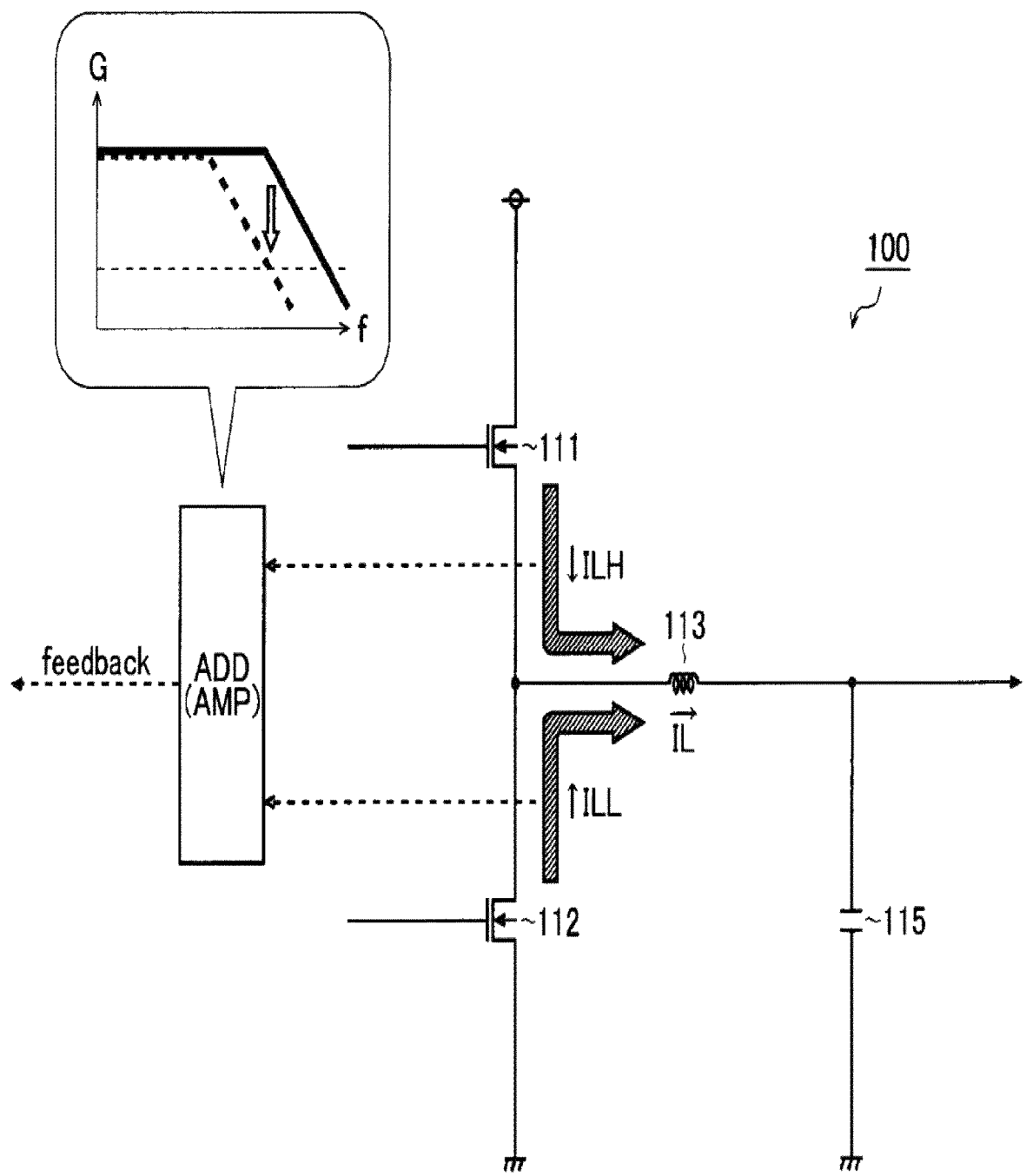
FIG. 4 is a diagram illustrating a third example of a current detection method (upper current and lower current addition method)

FIG. 4 is a diagram illustrating a third example of the current detection method (upper and lower current addition method). In the current detection method of this figure, the current information of the upper side inductor current ILH and the current information of the lower side inductor current ILL are added to each other and fed back to the control circuit 140. Accordingly, it becomes possible to cope with the higher switching frequency fsw. However, in this method, an amplifier may be necessary as a unit for adding the upper current information and the lower current information to each other, so that there is a limit in widening the band and high-speed response.

In the following, in view of the above consideration, a new current detection method capable of feeding back current information more appropriately will be proposed.

<Control Circuit>

Figure 5:
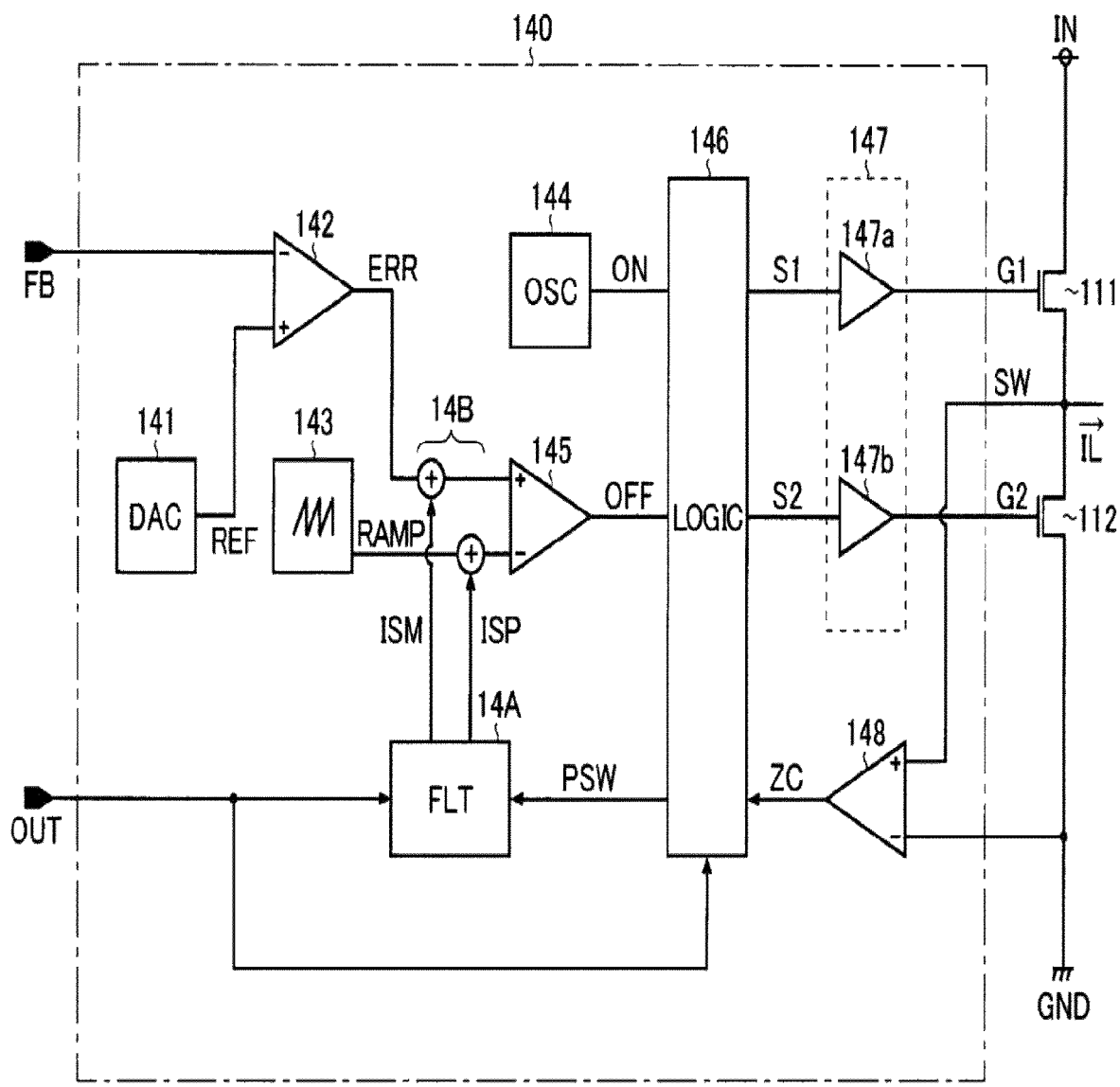
FIG. 5 is a diagram illustrating a configuration example of a control circuit.

FIG. 5 is a diagram illustrating a configuration example of the control circuit 140. The control circuit 140 of this configuration example includes a reference voltage generation circuit 141, an error amplifier 142, a ramp signal generation circuit 143, an oscillator 144, a comparator 145, a logic circuit 146, a drive circuit 147, a zero-cross detection unit 148, a filter unit 14A, and an adding section 14B.

The reference voltage generation circuit 141 generates the reference voltage REF for setting the target value of the output voltage OUT. As the reference voltage generation circuit 141, a digital-to-analog converter (DAC) that converts a digital reference voltage setting signal into an analog reference voltage REF is preferably used. With such a configuration, it becomes possible to achieve the soft start operation at the time of startup and adjust the output voltage OUT by using the above-mentioned reference voltage setting signal.

The error amplifier 142 generates an error signal ERR according to the difference between the feedback voltage FB applied to the inverting input terminal (−) and the reference voltage REF applied to the non-inverting input terminal (+). The error signal ERR increases when the feedback voltage FB is lower than the reference voltage REF and decreases when the feedback voltage FB is higher than the reference voltage REF. A phase compensation circuit (phase compensation resistance and phase compensation capacitance) may be connected between the output terminal of the error amplifier 142 and the inverting input terminal (−) or the ground terminal.

The ramp signal generation circuit 143 generates a ramp signal RAMP having a triangular wave shape, a sawtooth shape, or an nth-order slope wave shape (for example, n=2) that rises during the ON period Ton of the output transistor 111. The ramp signal RAMP starts rising from a zero value at the on-timing of the output transistor 111 and is reset to a zero value at the off-timing of the output transistor 111, for example.

The oscillator 144 generates an on-signal ON (=clock signal) which is pulse-driven at a predetermined frequency.

The comparator 145 compares a first addition signal RAMP+ISP (=a signal obtained by adding the ramp signal RAMP to a positive side current sense signal ISP) applied to the inverting input terminal (−) and a second addition signal ERR+ISM (=a signal obtained by adding the error signal ERR to a negative side current sense signal ISM) applied to the non-inverting input terminal (+), to generate the off-signal OFF. The off-signal OFF has a high level when the first addition signal RAMP+ISP is lower than the second addition signal ERR+ISM, and has a low level when the first addition signal RAMP+ISP is higher than the second addition signal ERR+ISM. That is, the pulse generation timing of the off-signal OFF is delayed more as the error signal ERR becomes higher or the positive side current sense signal ISP becomes lower, and becomes earlier as the error signal ERR becomes lower or the positive side current sense signal ISP becomes higher.

The logic circuit 146 basically generates an upper control signal S1 and a lower control signal S2 according to the on-signal ON and the off-signal OFF. To be more specific, the logic circuit 146 raises the upper control signal S1 to a high level and lowers the lower control signal S2 to a low level when a pulse is generated in the on-signal ON. As a result, since the output transistor 111 is turned on and the synchronous rectification transistor 112 is turned off, the switch voltage SW rises to a high level (≈VIN). On the other hand, the logic circuit 146 lowers the upper control signal S1 to a low level and raises the lower control signal S2 to a high level when a pulse is generated in the off-signal OFF. As a result, since the output transistor 111 is turned off and the synchronous rectification transistor 112 is turned on, the switch voltage SW falls to a low level (≈GND).

Therefore, a PWM control is performed so that the ON period Ton (=high level period TH of the switch voltage SW) of the output transistor 111 becomes longer as the pulse generation timing of the off-signal OFF is delayed more, and becomes shorter as the pulse generation timing of the off-signal OFF becomes earlier. That is, the on-duty D (=the ratio of the ON period Ton in one cycle) of the output transistor 111 increases as the error signal ERR increases or the positive side current sense signal ISP decreases, and decreases as the error signal ERR decreases or the positive side current sense signal ISP increases.

Further, the logic circuit 146 has a function of putting the switch output stage 110 into an output high impedance state (what is generally called a backflow prevention function) by turning off the synchronous rectification transistor 112 at the timing when a zero-cross detection signal ZC input from the zero-cross detection unit 148 rises from a low level to a high level (=the zero-cross detection timing of the inductor current IL), when the output transistor 111 is turned off and the synchronous rectification transistor 112 is turned on.

Still further, the logic circuit 146 also has a light load mode (PFM mode) in which switching pulses are thinned out to reduce switching loss by repeating drive stops of the switch output stage 110 (=the output high impedance state described above) and drive recoveries thereof (=restart complementary switching operation) in the range where the output voltage OUT does not fall below the target value, at the time of a light load.

In addition, the logic circuit 146 receives the input of the output voltage OUT and the zero-cross detection signal ZC and has a function of generating a pseudo switch voltage PSW simulating the behavior of the switch voltage SW (details will be described later).

The drive circuit 147 includes an upper driver 147a that receives an input of the upper control signal S1 and generates the upper gate signal G1; and a lower driver 147b that receives an input of the lower control signal S2 and generates the lower gate signal G2. Buffers or inverters can be used as the upper driver 147a and the lower driver 147b, respectively.

The zero-cross detection unit 148 monitors the voltage between the both ends of the synchronous rectification transistor 112 (=switch voltage SW) when the output transistor 111 is turned off and the synchronous rectification transistor 112 is turned on, so as to detect the zero-cross of the inductor current IL.

For example, as the zero-cross detection unit 148, a comparator that compares the switch voltage SW input to the non-inverting input terminal (+) with the ground voltage GND input to the inverting input terminal (−) and that then generates the zero-cross detection signal ZC is preferably used, as illustrated in the figure. The zero-cross detection signal ZC has a high level when SW>GND is satisfied and has a low level when SW<GND is satisfied.

The filter unit 14A receives the input of the pseudo switch voltage PSW and the output voltage OUT and generates a current sense signal (=differential voltage signal including the positive side current sense signal ISP and the negative side current sense signal ISM) simulating the behavior of the inductor current IL. The positive side current sense signal ISP is generated by performing an integration process (averaging process) on the pseudo switch voltage PSW with use of the negative side current sense signal ISM (=output voltage OUT or divided voltage thereof) as a reference potential.

The adding section 14B generates each of a first addition signal RAMP+ISP obtained by adding the ramp signal RAMP to the positive side current sense signal ISP and a second addition signal ERR+ISM obtained by adding the error signal ERR to the negative side current sense signal ISM. By such an addition process of current information, it becomes possible to perform output feedback control of the current mode control method.

That is, among the various functional units described above, at least the error amplifier 142, the ramp signal generation circuit 143, the adding section 14B, the oscillator 144, and the comparator 145 can be recognized as a feedback control unit (or constituent elements thereof) that performs output feedback control of the current mode control method with use of the positive side current sense signal ISP and the negative side current sense signal ISM.

<Current Detecting Operation>

Figure 6:
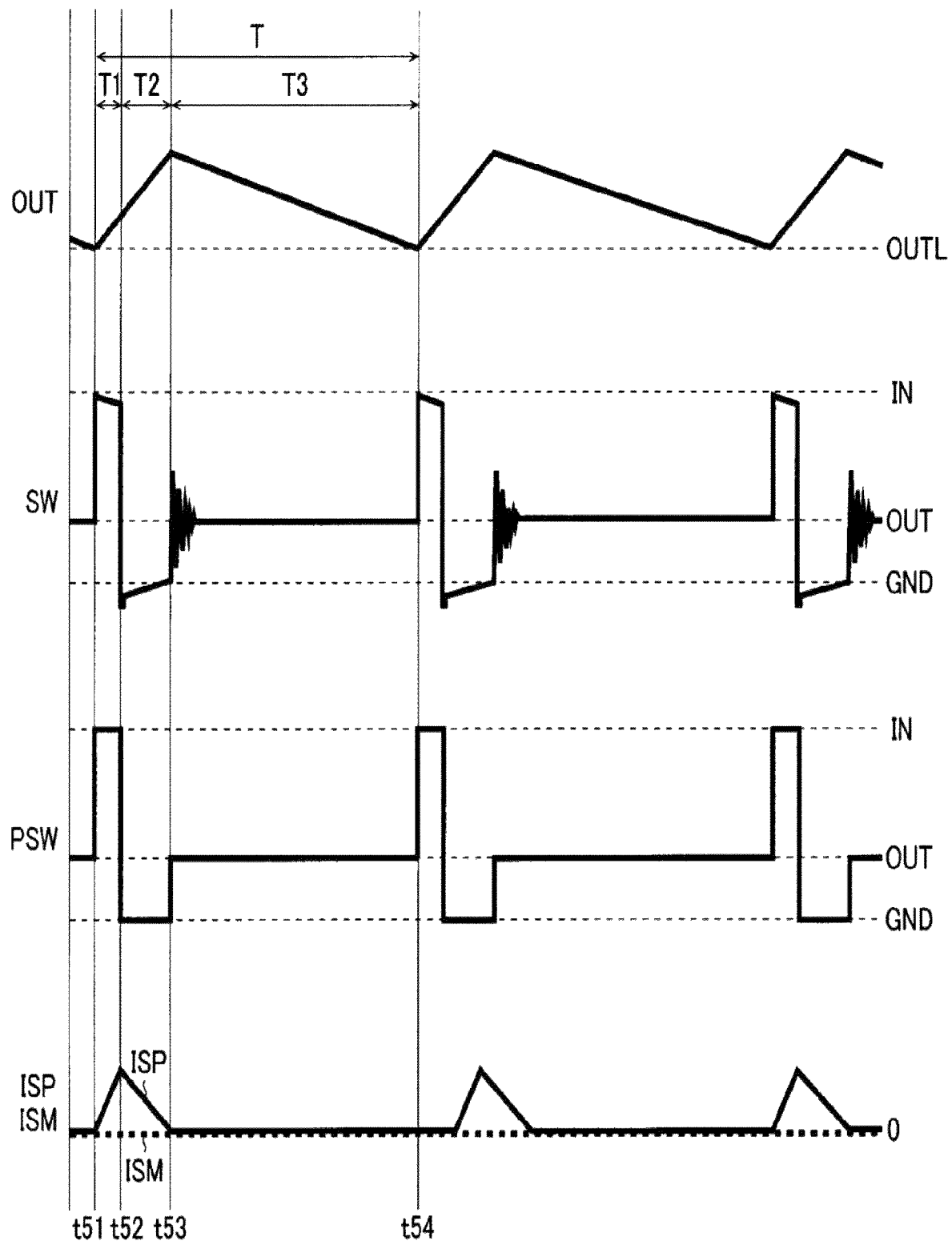
FIG. 6 is a diagram illustrating a first example of a current detecting operation (pulse frequency modulation (PFM) mode)

FIG. 6 is a diagram illustrating a first example of the current detecting operation (PFM mode: current discontinuous mode), and in order from the top, the behavior of each of the output voltage OUT, the switch voltage SW, the pseudo switch voltage PSW, the positive side current sense signal ISP (solid line), and the negative side current sense signal ISM (broken line) is depicted.

Regarding the inductor current IL, the direction from the external terminal T2 (=the terminal to which the switch voltage SW is applied) to the inductor 113 is defined as a positive direction (+), and the direction from the inductor 113 to the external terminal T2 is defined as a negative direction (−).

Before time t51, both the output transistor 111 and the synchronous rectification transistor 112 have been turned off.

At time t51, when the output voltage OUT decreases to a predetermined lower limit value OUTL (≥target value), the output transistor 111 is turned on. Accordingly, since the inductor current IL in the positive direction starts to flow in the path from the application terminal of the input voltage IN to the inductor 113 via the output transistor 111, the output voltage OUT starts to rise.

At this time, the switch voltage SW is a positive voltage (=IN−VdsH) lower than the input voltage IN by the drain-source voltage VdsH of the output transistor 111 (=RonH× $I_L$, where RonH is the ON resistance value of the output transistor 111).

The drain-source voltage VdsH described above increases as the inductor current IL increases, and decreases as the inductor current IL decreases. Therefore, in a period T1 (=time t51 to t52), the switch voltage SW decreases as the inductor current IL increases.

During the period T1, the input voltage IN is output as the pseudo switch voltage PSW so as to simulate the high level (=IN−VdsH) switch voltage SW. Therefore, the positive side current sense signal ISP rises with the passage of time. As a result, the differential current sense signal IS obtained by subtracting the negative side current sense signal ISM from the positive side current sense signal ISP (=ISP−ISM) increases with a positive value.

At time t52, the output transistor 111 is turned off and the synchronous rectification transistor 112 is turned on. At this time, a counter electromotive force is generated in the inductor 113 by the electric energy stored during the period T1. Accordingly, the inductor current IL in the positive direction continues to flow in the current path from the application terminal of the ground voltage GND to the inductor 113 via the synchronous rectification transistor 112. When the inductor current IL is larger than the load current flowing through the load Z, since the charging of the capacitor 115 is continued, the output voltage OUT continues to rise.

At this time, the switch voltage SW is a negative voltage (=GND−VdsL) lower than the ground voltage GND by the drain-source voltage VdsL of the synchronous rectification transistor 112 (=RonL×IL, where RonL is the ON resistance value of the synchronous rectification transistor 112).

The drain-source voltage VdsL described above increases as the inductor current IL increases and decreases as the inductor current IL decreases. Accordingly, during a period T2 (=time t52 to t53), the switch voltage SW increases as the inductor current IL decreases.

Further, during the period T2, the ground voltage GND is output as the pseudo switch voltage PSW so as to simulate the low-level (=GND−VdsL) switch voltage SW. Accordingly, the positive side current sense signal ISP decreases with the passage of time. As a result, the differential current sense signal IS (=ISP−ISM) approaches a zero value.

At time t53, when the switch voltage SW rises to the ground voltage GND, the synchronous rectification transistor 112 is turned off. In this way, the synchronous rectification transistor 112 is turned off at the zero-cross detection timing (ZC=H) of the inductor current IL. Therefore, since the reverse flow of the inductor current IL (=the discharge of the output voltage OUT through the synchronous rectification transistor 112) can be suppressed, the efficiency of the switching power supply 100 can be improved.

When both the output transistor 111 and the synchronous rectification transistor 112 are turned off, the external terminal T2 is put into a high impedance state. Therefore, during a period T3 (=time t53 to t54), the output voltage OUT gradually decreases with an inclination according to the load current. Further, the switch voltage SW causes ringing immediately after the synchronous rectification transistor 112 is turned off, but finally becomes substantially equal to the output voltage OUT.

Further, during the period T3, the output voltage OUT is output as the pseudo switch voltage PSW so as to simulate the switch voltage SW (≈OUT) describe above. Hence, the positive side current sense signal ISP agrees with the negative side current sense signal ISM. As a result, the differential current sense signal IS (=ISP−ISM) becomes zero.

After that, at time t54, when the output voltage OUT falls again to the predetermined lower limit value OUTL, the output transistor 111 is turned on, and the output voltage OUT starts to rise. After that, by performing a switching operation similar to that described above, the drive stop and drive recovery of the switch output stage 110 are repeated within a range in which the output voltage OUT does not fall below the target value.

As described above, in the PFM mode, the length of the period T3 (and thus, the switching cycle T (=T1+T2+T3)) varies according to the load current. That is, the switching frequency Fsw (=1/T) of the switch output stage 110 changes according to the load current.

Figure 7:
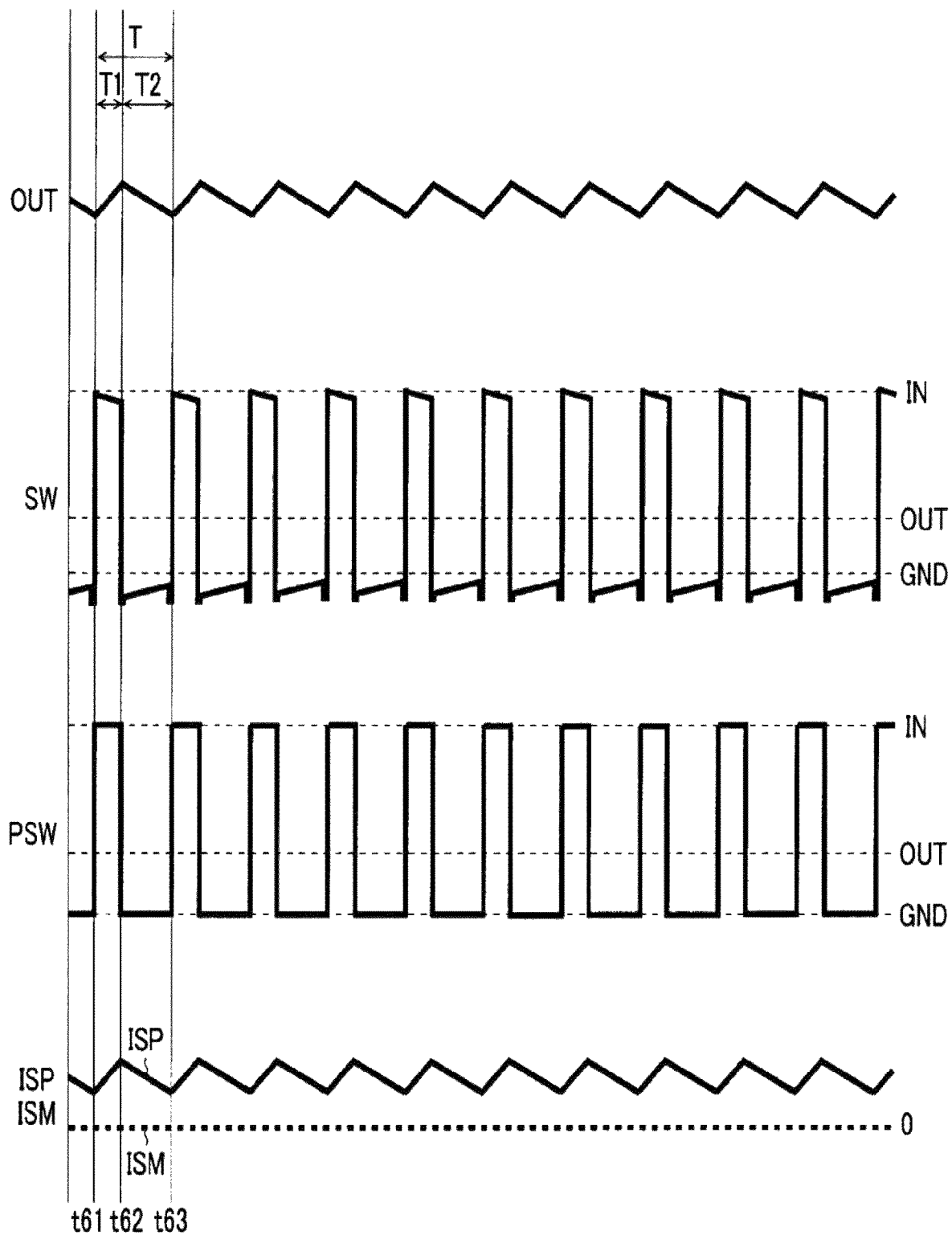
FIG. 7 is a diagram illustrating a second example of a current detecting operation (pulse width modulation (PWM) mode)

FIG. 7 is a diagram illustrating a second example (PWM mode: current continuous mode) of the current detecting operation, and similarly to FIG. 6 described above, the behavior of each of the output voltage OUT, the switch voltage SW, the pseudo switch voltage PSW, the positive side current sense signal ISP (solid line), and the negative side current sense signal ISM (broken line) is depicted in order from the top.

At time t61, the output transistor 111 is turned on, and the synchronous rectification transistor 112 is turned off. At this time, since the inductor current IL in the positive direction starts to flow, the output voltage OUT starts to rise.

During the period T1 (=time t61 to t62), the switch voltage SW (=IN−VdsH) decreases as the inductor current IL increases. Further, during the period T1, the input voltage IN is output as the pseudo switch voltage PSW. Therefore, the positive side current sense signal ISP rises with the passage of time, and eventually, the difference current sense signal IS (=ISP−ISM) obtained by subtracting the negative side current sense signal ISM from the positive side current sense signal ISP increases with a positive value.

At time t62, the output transistor 111 is turned, off and the synchronous rectification transistor 112 is turned on. At this time, due to the counter electromotive force of the inductor 113, the inductor current IL in the positive direction continues to flow. However, when the load current is larger than the inductor current IL, the capacitor 115 is discharged so that the output voltage OUT turns from rising to falling.

During the period T2 (=time t62 to t63), the switch voltage SW (=GND−VdsL) rises as the inductor current IL decreases. Further, during the period T2, the ground voltage GND is output as the pseudo switch voltage PSW. Accordingly, the positive side current sense signal ISP decreases with the passage of time, and eventually, the differential current sense signal IS (=ISP−ISM) approaches a zero value.

At time t63, the output transistor 111 is turned on and the synchronous rectification transistor 112 is turned off again before the switch voltage SW reaches the ground voltage GND. Therefore, the switch output stage 110 may not switch to the drive stop state (=output high impedance state).

After that, by performing a switching operation similar to that described above, the switch voltage SW becomes a rectangular wave signal in which the high level (=IN−VdsH) and the low level (=GND−VdsL) are alternately repeated.

As described above, in the PWM mode, the switching cycle T (=T1+T2) of the switch output stage 110, and thus, the switching frequency Fsw (=1/T), has a fixed value.

The pseudo switch voltage PSW becomes a rectangular wave signal that alternately repeats the high level (=IN) and low level (=GND) so as to simulate the switch voltage SW having the above behavior. Thus, the positive side current sense signal ISP becomes a triangular wave signal which alternately repeats rising and falling without intersecting with the negative side current sense signal ISM. As a result, the differential current sense signal IS (=ISP−ISM) typically maintains a positive value.

As apparent from FIGS. 6 and 7, the behavior of the differential current sense signal IS obtained by subtracting the negative side current sense signal ISM from the positive side current sense signal ISP (=ISP−ISM) is equivalent to the behavior of the inductor current IL. Accordingly, the control circuit 140 can perform the output feedback control of the current mode control method by using the positive side current sense signal ISP and the negative side current sense signal ISM.

In particular, in order to obtain the current information regarding the inductor current IL, with a configuration for generating the pseudo switch voltage PSW simulating the switch voltage SW inside the control circuit 140 (for example, the logic circuit 146), instead of a configuration for directly detecting the switch voltage SW, the current information can typically be fed back accurately regardless of the pulse width of the switch voltage SW (the high level period TH and the low level period TL).

Therefore, as compared with the above-mentioned upper side current detection method (FIG. 2) and lower side current detection method (FIG. 3), output feedback control of the current mode control method can be performed in a wider duty range (for example, 0% to 100%). Further, it also becomes possible to cope with a higher switching frequency fsw.

Further, unlike the above-described upper current and lower current addition method (FIG. 4), an amplifier for adding the upper and lower current information may not be necessary, which is advantageous in terms of widening the band and high-speed response. Further, by reduction of amplifiers, area saving and power saving can be achieved.

In addition, in the case of a configuration in which the switch voltage SW is not directly detected, for example, even a power supply control device to which an output transistor and a synchronous rectification transistor are externally attached, and which has no input terminal for the switch voltage SW, such as a driver MOS (DrMOS) controller IC, can perform the output feedback control of the current mode control method.

Further, with this configuration, there is less concern about malfunction due to switching noise superimposed on the switch voltage SW. Thus, masking process of the switch voltage SW or the like can be omitted. In addition, since it is possible to relax measures against noise in the package of the semiconductor device 200 and the printed wiring board on which a semiconductor substrate 200 is mounted, the degree of freedom can be increased in designing of devices or sets.

Further, according to this configuration, the feedback accuracy of the current information is less likely to depend on the wiring layout of each of the output transistor 111 and the synchronous rectification transistor 112 (for example, the position of the pad to which the switch voltage SW is applied and the laying route of the metal wiring connected thereto).

<Logic Circuit>

Figure 8:
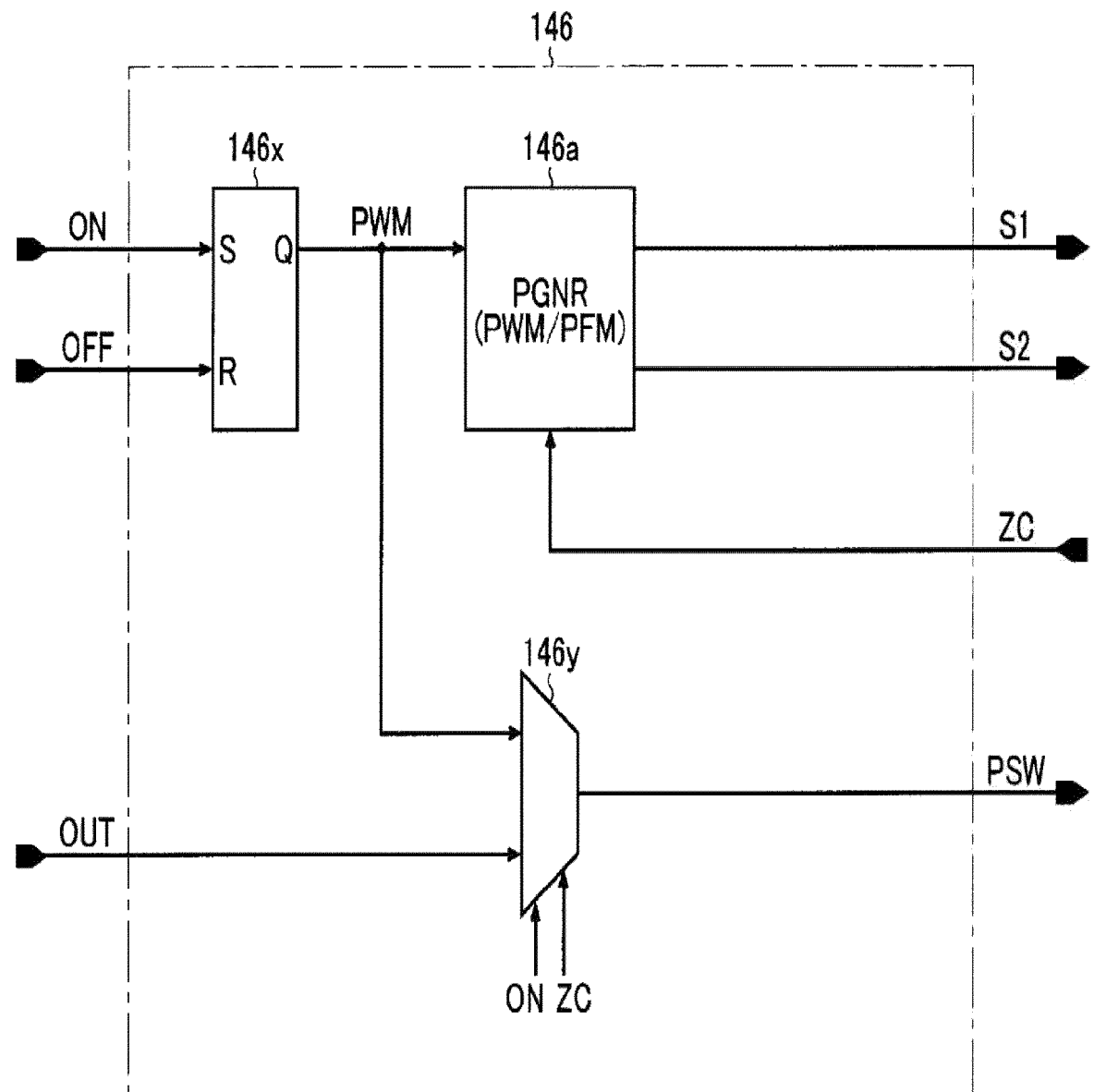
FIG. 8 is a diagram illustrating a configuration example of a logic circuit.

FIG. 8 is a diagram illustrating a configuration example of the logic circuit 146. The logic circuit 146 of this configuration example includes a pulse generation unit 146a, a reset-set (RS) flip-flop 146x, and a multiplexer 146y.

The RS flip-flop 146x determines the logic level of a pulse width modulation signal PWM output from the output terminal Q, on the basis of the on-signal ON input to the set terminal S and the off-signal OFF input to the reset terminal R. For example, the RS flip-flop 146x sets the pulse width modulation signal PWM to a high level at the pulse generation timing of the on-signal ON and resets the pulse width modulation signal PWM to a low level at the pulse generation timing of the off-signal OFF.

The pulse generation unit 146a basically turns on/off the output transistor 111 and the synchronous rectification transistor 112 complementarily by generating the upper control signal S1 and the lower control signal S2 according to the pulse width modulation signal PWM.

However, when the zero-cross detection signal ZC rises to a high level at the time of S1=L and S2=H, the pulse generation unit 146a lowers the lower control signal S2 to a low level and sets S1=S2=L. As a result, both the output transistor 111 and the synchronous rectification transistor 112 are turned off, so that the switch output stage 110 is switched into the drive stop state (=the state in which the external terminal T2 is in high impedance). Accordingly, since the reverse flow of the inductor current IL can be suppressed, the efficiency of the switching power supply 100 can be improved.

When the switching power supply 100 has been shifted from the normal mode (PWM mode) to the light load mode (PFM mode), after causing the switch output stage 110 to be in the above-mentioned drive stop state at the zero-cross detection timing of the inductor current IL, the logic circuit 146 may control the oscillator 144 to stop sending the on-signal ON or may ignore (or mask) the on-signal ON until the drive recovery timing of the switch output stage 110 (=the on-timing of the output transistor 111) arrives.

Further, regarding the transition to the light load mode, for example, when the output voltage OUT becomes higher than the target value and the feedback voltage FB exceeds the light load transition voltage (=α×VREF, where α>1), it is advisable to shift from the normal mode (PWM mode) to the light load mode (PFM mode).

In addition, as for the recovery from the light load mode, for example, when the output voltage OUT drops near the target value and the feedback voltage FB falls below the light load release voltage (=β×VREF, where 1<β<α), it is advisable to return from the light load mode to the normal mode.

As a matter of course, the conditions for shifting/restoring regarding the light load mode are not limited to the above, and, for example, it may be detected whether or not the error signal ERR is below the DC offset value of the ramp signal RAMP, or alternatively, it may be detected whether or not the off-signal OFF is fixed to a low level over a predetermined period of time. Moreover, implementation of the light load mode may not be essential.

The multiplexer 146y selectively outputs one of the pulse width modulation signal PWM and the output voltage OUT as the pseudo switch voltage PSW according to the on-signal ON and the zero-cross detection signal ZC. For example, the multiplexer 146y selectively outputs the pulse width modulation signal PWM as the pseudo switch voltage PSW from the time when the on-signal ON (and thus, the pulse width modulation signal PWM) rises to a high level until the zero-cross detection signal ZC rises to a high level. Further, for example, the multiplexer 146y selectively outputs the output voltage OUT as the pseudo switch voltage PSW from the time when the zero-cross detection signal ZC rises to the high level until the on-signal ON (and thus, the pulse width modulation signal PWM) rises to the high level.

The pulse width modulation signal PWM is a rectangular wave-shaped pulse voltage that becomes the input voltage IN during the high level period and becomes the ground voltage GND during the low level period. Therefore, the pseudo switch voltage PSW can take three levels of voltage values (high level: IN, middle level: OUT, and low level: GND) depending on the selection state of the multiplexer 146y. Hereinafter, a specific description will be given with reference to the drawings.

Figure 9:
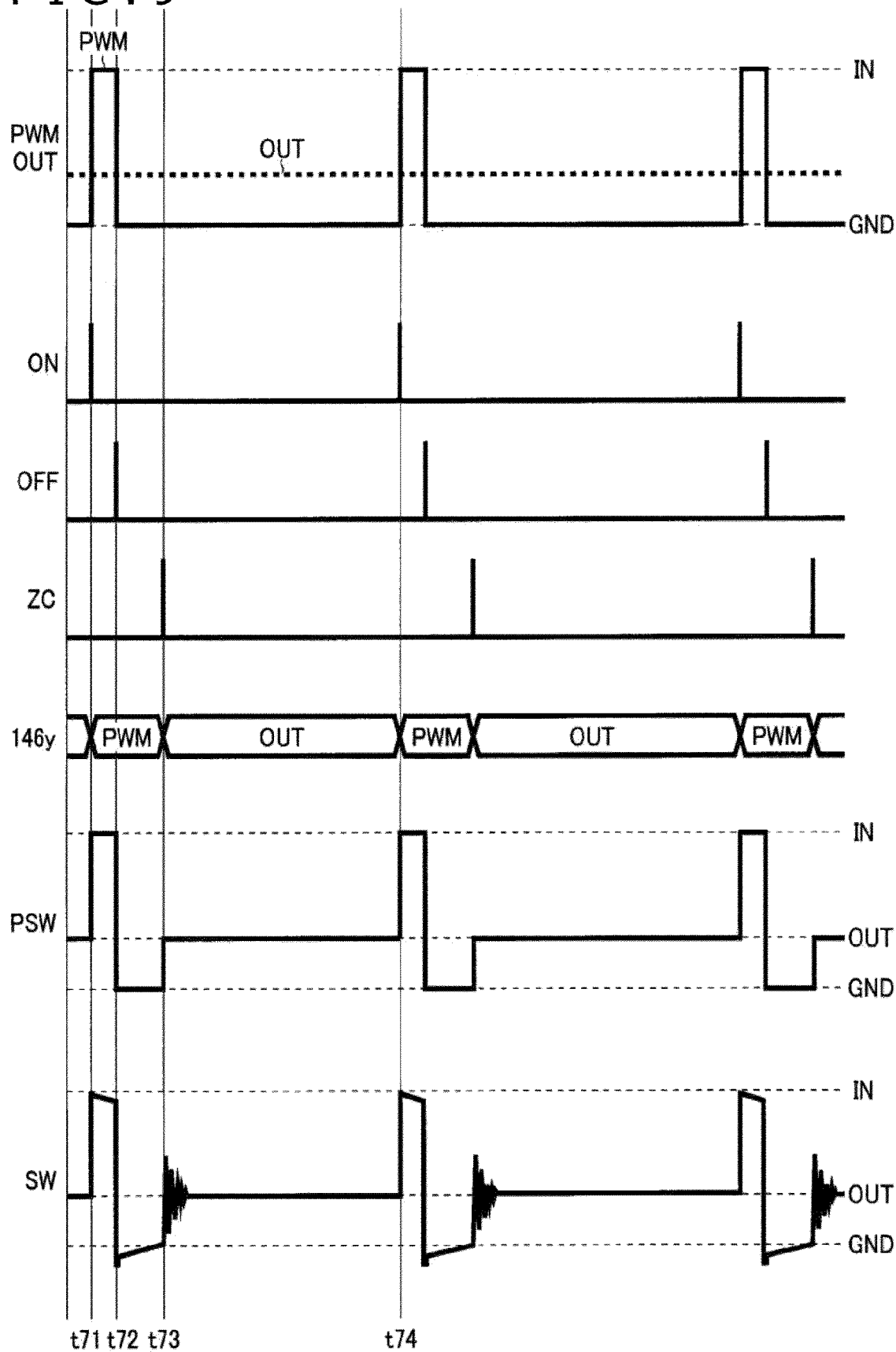
FIG. 9 is a diagram illustrating a generating operation of a pseudo switch voltage.

FIG. 9 is a diagram illustrating a generating operation of the pseudo switch voltage PSW in the light load mode (PFM mode: current discontinuous mode), and in order from the top, the pulse width modulation signal PWM (solid line), the output voltage OUT (broken line), the on-signal ON, the off-signal OFF, the zero-cross detection signal ZC, the selection state of the multiplexer 146y, the pseudo switch voltage PSW, and the switch voltage SW are illustrated.

At time t71, when the on-signal ON rises to a high level, the pulse width modulation signal PWM is set to the high level (=input voltage IN). At this time, in response to the high level transition of the on-signal ON, the multiplexer 146y selectively outputs the pulse width modulation signal PWM as the pseudo switch voltage PSW. Accordingly, the pseudo switch voltage PSW is raised to the high level (=input voltage IN) so as to simulate the high level switch voltage SW (=IN−VdsH).

At time t72, when the off-signal OFF rises to a high level, the pulse width modulation signal PWM is reset to the low level (=ground voltage GND). At this time, the multiplexer 146y continues to selectively output the pulse width modulation signal PWM as the pseudo switch voltage PSW. Therefore, the pseudo switch voltage PSW is lowered to the low level (=ground voltage GND) so as to simulate the low level switch voltage SW (=GND−VdsL).

At time t73, when the zero-cross detection signal ZC rises to a high level, the switch output stage 110 is in the drive stop state (=output high impedance state), so that the switch voltage SW substantially agrees with the output voltage OUT. At this time, in response to the high-level transition of the zero-cross detection signal ZC, the multiplexer 146y selectively outputs the output voltage OUT as the pseudo switch voltage PSW. Accordingly, the pseudo switch voltage PSW is switched to the middle level (=output voltage OUT) so as to simulate the middle level switch voltage SW (≈OUT).

Also after time t74, the pseudo switch voltage PSW is continuously generated by repeating an operation similar to that described above.

Although not illustrated again, in the normal mode (PWM mode: current continuous mode), the zero-cross detection signal ZC does not rise to the high level. Therefore, the multiplexer 146y is in a state of typically selecting and outputting the pulse width modulation signal PWM as the pseudo switch voltage PSW. Further, if the control circuit 140 does not have the reverse flow prevention function (zero-cross detection function), it is sufficient that the multiplexer 146y is omitted and the pulse width modulation signal PWM is output as the pseudo switch voltage PSW.

<Adding Section>

FIG. 10 is a diagram illustrating a configuration example of the comparator 145 (particularly, the input stage) and the adding section 14B. The input stage of the comparator 145 includes P-channel MOS field effect transistors P1 to P4, N-channel MOS field effect transistors N1 and N2, and a current source CS1.

The sources of the transistors P1 and P2 are both connected to the power supply terminal. The drain of the transistor P1 and the source of the transistor P3 are both connected to the drain of the transistor N1. The drain of the transistor P2 and the source of the transistor P4 are both connected to the drain of the transistor N2. The sources of the transistors N1 and N2 are both connected to the first terminal of the current source CS1. The second terminal of the current source CS1 is connected to the ground terminal. The gate of the transistor N1 is connected to the application terminal of the ramp signal RAMP. The gate of the transistor N2 is connected to the application terminal of the error signal ERR.

On the other hand, the adding section 14B includes N-channel MOS field effect transistors N3 and N4 and a current source CS2.

The drain of the transistor N3 is connected to the drain of the transistor N1. The drain of the transistor N4 is connected to the drain of the transistor N2. The sources of the transistors N3 and N4 are both connected to the first terminal of the current source CS2. The second terminal of the current source CS2 is connected to the ground terminal. The gate of the transistor N3 is connected to the application terminal of the positive side current sense signal ISP. The gate of the transistor N4 is connected to the application terminal of the negative side current sense signal ISM.

According to the adding section 14B of the present configuration example, the positive side current sense signal ISP and the negative side current sense signal ISM of the differential type can easily be added to the ramp signal RAMP and the error signal ERR respectively by a simple circuit configuration.

Further, for example, the detection sensitivity of the current information can be increased or decreased by optionally adjusting the current ratio of drive currents Idrv1 and Idrv2 generated by the current sources CS1 and CS2 respectively, so that optimal current feedback control can be performed according to the input dynamic range of the comparator 145.

<Filter Unit>

FIG. 11 is a diagram illustrating a first configuration example of the filter unit 14A. The filter unit 14A of this configuration example includes a capacitor C and resistors R21 to R24.

The first end of the capacitor C is connected to the application terminal of the positive side current sense signal ISP. The second end of the capacitor C is connected to the application terminal of the negative side current sense signal ISM.

The first end of the resistor R21 is connected to the application terminal of the pseudo switch voltage PSW. The second end of the resistor R21 is connected to the application terminal of the positive side current sense signal ISP.

The first end of the resistor R22 is connected to the application terminal of the output voltage OUT. The second end of the resistor R22 is connected to the application terminal of the negative side current sense signal ISM.

The first end of the resistor R23 is connected to the application terminal of the positive side current sense signal ISP. The second end of the resistor R23 is connected to the reference potential terminal (=ground terminal GND).

The first end of the resistor R24 is connected to the application terminal of the negative side current sense signal ISM. The second end of the resistor R24 is connected to the reference potential terminal (=ground terminal GND).

In addition, an inductor L, a resistor R11, and a resistor R12 depicted outside the filter unit 14A respectively correspond to the inductance component of the inductor 113, the impedance component of the switch output stage 110 (for example, including the ON resistance of each of the output transistor 111 and the synchronous rectification transistor 112), and the equivalent series resistance component of the inductor 113.

In the filter unit 14A of this configuration example, in the case where the voltages across the resistors R11 and R12 are VA1 and VA2 respectively and the voltage across the capacitor C is VB, when the capacitance value of the capacitor C and the resistance values of the resistors R21 to R24 are set so that the following equations (1) and (2) are satisfied, the following equation (3) is established.

$$(R11+R12) \times \{(R21//R23)+(R22//R24)\}=L/C \quad (1)$$

$$R23/(R21+R23)=R24/(R22+R24) \quad (2)$$

$$VB=R23/(R21+R23)(VA1+VA2) \quad (3)$$

Here, the both-end voltages VA1 and VA2 in the equation (3) are voltage signals having current information regarding the inductor current IL, respectively. Hence, the both-end voltage VB appearing between both ends of the capacitor C (=ISP−ISM) is also a voltage signal having current information regarding the inductor current IL.

As described above, in the case of the filter unit 14A of this configuration example, the pseudo current waveform simulating the behavior of the inductor current IL (=voltage VB between both ends) can be generated by a simple circuit configuration (=RC filter configuration using only the capacitor C and the resistors R21 to R24).

The resistors R23 and R24 are provided for the purpose of matching (reducing) each of the positive side current sense signal ISP and the negative side current sense signal ISM with appropriate signal levels. However, if there is no such need, the resistors R23 and R24 may be omitted.

Figure 12:
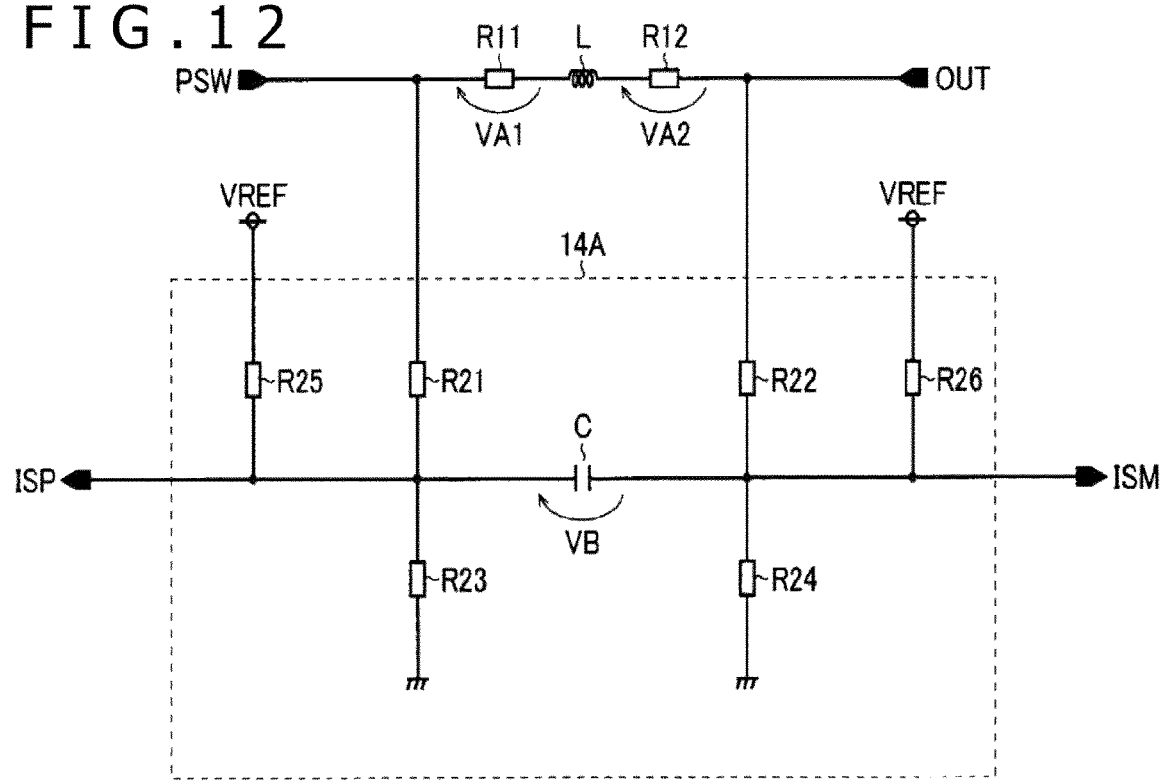
FIG. 12 is a diagram illustrating a second configuration example of the filter unit.

FIG. 12 is a diagram illustrating a second configuration example of the filter unit 14A. The filter unit 14A of this configuration example is based on FIG. 11 described above and further includes resistors R25 and R26.

The first end of the resistor R25 is connected to the application terminal of an internal power supply voltage VREF. The second end of the resistor R25 is connected to the application terminal of the positive side current sense signal ISP.

The first end of the resistor R26 is connected to the application terminal of the internal power supply voltage VREF. The second end of the resistor R26 is connected to the application terminal of the negative side current sense signal ISM.

With the filter unit 14A of this configuration example, the positive side current sense signal ISP and the negative side current sense signal ISM can be subjected to a DC bias by the internal power supply voltage VREF even if the output voltage OUT has a zero value. Thus, for example, even if the adding section 14B has a configuration in which the gates of the NMOSFETs receive each of the positive side current sense signal ISP and the negative side current sense signal ISM (see FIG. 10 mentioned above), the operation of the adding section 14B will have no trouble.

Figure 13:
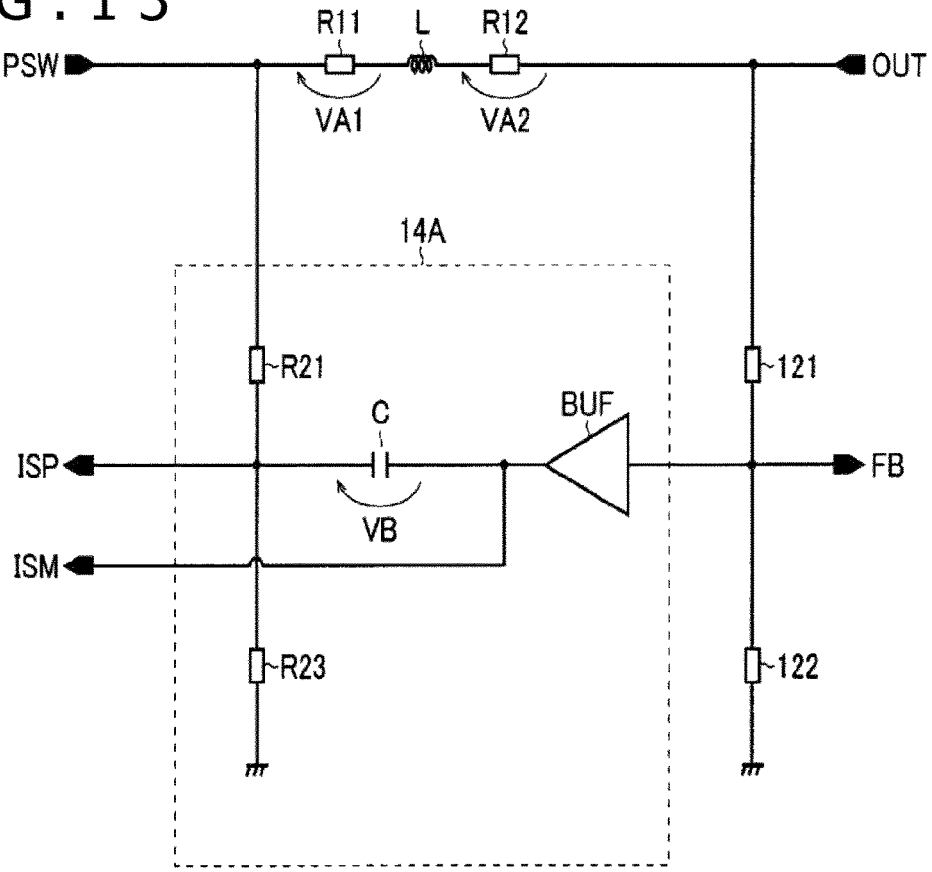
FIG. 13 is a diagram illustrating a third configuration example of the filter unit.

FIG. 13 is a diagram illustrating a third configuration example of the filter unit 14A. The filter unit 14A of this configuration example is based on FIG. 11 described above, with the resistors R22 and R24 omitted, and includes a buffer BUF instead of these resistors.

The input terminal of the buffer BUF is connected to the application terminal of the feedback voltage FB (=connection node between the resistors 121 and 122). The output terminal of the buffer BUF is connected to the application terminal of the negative side current sense signal ISM.

In this way, the resistors R22 and R24 can be omitted in the case of a configuration in which the input of the feedback voltage FB is received. When this configuration example is adopted, the resistance values of the resistors R22 and R24 in the above equations (1) to (3) may be recognized as the resistance values of the resistors 121 and 122, respectively.

Further, in the filter unit 14A of this configuration example, the buffer BUF is inserted between the application terminal of the feedback voltage FB and the capacitor C. Therefore, the influence of the capacitor C on the voltage feedback loop can be reduced.

<Other Modifications>

Various technical features disclosed in the present specification can be modified in various ways other than the above-described embodiments without departing from the gist of the technical creation. For example, the mutual replacement of the bipolar transistor and the MOS field effect transistor and the logical level inversion of various signals are optional. That is, the above-described embodiments are exemplifications in all respects and should be considered not to be restrictive, so that the technical scope of the present disclosure is not limited to the above-mentioned embodiments. It is to be understood that all the changes belonging to a meaning and a range equivalent to the scope of patent claims are included.

The power supply control device disclosed in the present specification can be used as a control main body of a switching power supply mounted in various applications.

What is claimed is:

1. A power supply control device that is a control main body of a switching power supply that generates an output voltage from an input voltage by driving an inductor current with use of a switch output stage, the device comprising:
   a logic circuit for generating a pseudo switch voltage simulating a behavior of a switch voltage generated in the switch output stage;
   a filter unit that receives the pseudo switch voltage and the output voltage or a feedback voltage corresponding to the output voltage and generates a current sense signal simulating a behavior of the inductor current; and a feedback control unit that performs output feedback control of the switch output stage by using the current sense signal.

2. The power supply control device according to claim 1, wherein
the current sense signal is a differential signal including a positive side current sense signal and a negative side current sense signal.

3. The power supply control device according to claim 2, wherein
the filter unit includes
a capacitor connecting an application terminal of the positive side current sense signal and an application terminal of the negative side current sense signal,
a first resistor connecting an application terminal of the pseudo switch voltage and the application terminal of the positive side current sense signal, and
a second resistor connecting an application terminal of the output voltage and the application terminal of the negative side current sense signal.

4. The power supply control device according to claim 3, wherein
the filter unit further includes
a third resistor connecting the application terminal of the positive side current sense signal and a reference potential terminal, and
a fourth resistor connecting the application terminal of the negative side current sense signal and the reference potential terminal.

5. The power supply control device according to claim 3, wherein
the filter unit further includes
a fifth resistor connecting an internal power supply terminal and the application terminal of the positive side current sense signal, and
a sixth resistor connecting the internal power supply terminal and the application terminal of the negative side current sense signal.

6. The power supply control device according to claim 2, wherein
the filter unit includes
a capacitor connecting an application terminal of the positive side current sense signal and an application terminal of the negative side current sense signal,
a first resistor connecting an application terminal of the pseudo switch voltage and the application terminal of the positive side current sense signal,
a second resistor connecting the application terminal of the positive side current sense signal and a reference potential terminal, and
a buffer having an input terminal connected to an application terminal of the feedback voltage and an output terminal connected to the application terminal of the negative side current sense signal.

7. The power supply control device according to claim 2, wherein
the feedback control unit includes
an error amplifier that generates an error signal according to a difference between the output voltage or the feedback voltage and a predetermined reference voltage,
a ramp signal generation circuit that generates a ramp signal,
an adding section that generates a first addition signal obtained by adding the ramp signal to the positive side current sense signal and a second addition signal obtained by adding the error signal to the negative side current sense signal,
an oscillator that generates an on-signal that is pulse-driven at a predetermined frequency, and
a comparator that generates an off-signal by comparing the first addition signal with the second addition signal, and
the feedback control unit performs output feedback control of the switch output stage by using the on-signal and the off-signal.

8. The power supply control device according to claim 1, wherein
the switch output stage includes an output transistor and a synchronous rectification transistor, and
the logic circuit turns off the synchronous rectification transistor so as to put the switch output stage into an output high impedance state when a zero cross of the inductor current is detected while the output transistor is turned off and the synchronous rectification transistor is turned on.

9. The power supply control device according to claim 8, wherein
the logic circuit includes
a pulse generation unit that generates a control signal for each of the output transistor and the synchronous rectification transistor, according to a pulse voltage, and
a multiplexer that selectively outputs one of the pulse voltage and the output voltage as the pseudo switch voltage, according to a result of the zero-cross detection of the inductor current.

10. The power supply control device according to claim 1, wherein
the power supply control device is integrated in a semiconductor device.

11. A switching power supply comprising:
a power supply control device that is a control main body of a switching power supply that generates an output voltage from an input voltage by driving an inductor current with use of a switch output stage, the device including
a logic circuit for generating a pseudo switch voltage simulating a behavior of a switch voltage generated in the switch output stage,
a filter unit that receives the pseudo switch voltage and the output voltage or a feedback voltage corresponding to the output voltage and generates a current sense signal simulating a behavior of the inductor current, and
a feedback control unit that performs output feedback control of the switch output stage by using the current sense signal.

* * * * *